United States Patent
Hekmatshoartabari et al.

(10) Patent No.: US 10,347,599 B2
(45) Date of Patent: Jul. 9, 2019

(54) TERAHERTZ DETECTOR COMPRISED OF P-N JUNCTION DIODE

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/033,181

(22) Filed: Jul. 11, 2018

(65) Prior Publication Data

US 2018/0331052 A1    Nov. 15, 2018

Related U.S. Application Data

(62) Division of application No. 15/484,172, filed on Apr. 11, 2017.

(51) Int. Cl.
*H01L 21/02* (2006.01)
*H01L 23/66* (2006.01)
(Continued)

(52) U.S. Cl.
CPC .......... *H01L 23/66* (2013.01); *H01L 21/0262* (2013.01); *H01L 21/02488* (2013.01); *H01L 21/02532* (2013.01); *H01L 21/02576* (2013.01); *H01L 21/02579* (2013.01); *H01L 21/26513* (2013.01); *H01L 21/324* (2013.01);
(Continued)

(58) Field of Classification Search
CPC .......... H01L 29/66136; H01L 29/0649; H01L 29/16; H01L 29/86
See application file for complete search history.

(56) References Cited

U.S. PATENT DOCUMENTS 9,514,987 B1   12/2016   Gambino
9,627,275 B1   4/2017    Kwan
(Continued)

OTHER PUBLICATIONS

Z. Ahmad, et. al., "THz Detection Using p+/n-Well Diodes Fabricated in 45-nm CMOS," IEEE Elect. Dev. Lett. vol. 37, No. 7, pp. 823-826, Jul. 2016 (Abstract only).

*Primary Examiner* — Stephen M Bradley
*Assistant Examiner* — Wasiul Haider
(74) *Attorney, Agent, or Firm* — L. Jeffrey Kelly, Esq.; Hoffmann & Baron, LLP

(57) ABSTRACT

A method of forming a semiconductor detector including: forming a p-n junction diode in an active device layer of a silicon-on-insulator (SOI) substrate, the active device layer being formed on an insulator layer of the SOI substrate; forming a first opening through the insulator layer to access a backside of a first doped region of the diode, the first doped region underlying a second doped region of the diode; forming a back contact on a back surface of the first doped region and electrically connecting with the first doped region; forming a conductive interconnect layer on an upper surface of the SOI substrate, the interconnect layer including a first top contact providing electrical connection with the second doped region; and forming an electrode in the first opening on the backside of the detector structure, the electrode providing electrical connection with the back contact of the diode.

7 Claims, 11 Drawing Sheets

(51) Int. Cl.
  *H01L 27/12* (2006.01)
  *H01L 29/06* (2006.01)
  *H01L 29/16* (2006.01)
  *H01L 29/66* (2006.01)
  *H01L 31/00* (2006.01)
  *H01L 21/265* (2006.01)
  *H01L 21/324* (2006.01)
  *H01L 21/762* (2006.01)
  *H01L 29/861* (2006.01)

(52) U.S. Cl.
  CPC .... *H01L 21/76264* (2013.01); *H01L 27/1203* (2013.01); *H01L 29/0649* (2013.01); *H01L 29/16* (2013.01); *H01L 29/66136* (2013.01); *H01L 29/8613* (2013.01); *H01L 31/00* (2013.01)

(56) References Cited

U.S. PATENT DOCUMENTS

| | | | |
|---|---|---|---|
| 2008/0237785 | A1 | 10/2008 | Simonnet |
| 2014/0035129 | A1* | 2/2014 | Stuber ............... H01L 23/49811 257/737 |
| 2014/0117490 | A1* | 5/2014 | Yamashita .......... H01L 27/0255 257/506 |
| 2014/0224307 | A1* | 8/2014 | Chen .................... H01L 31/077 136/255 |
| 2015/0091092 | A1* | 4/2015 | Lee ....................... H01L 27/088 257/368 |
| 2015/0206947 | A1 | 7/2015 | Hekmatshoartabari |
| 2016/0148921 | A1* | 5/2016 | Mallikararjunaswamy ................ H01L 27/0259 257/491 |
| 2016/0336990 | A1 | 11/2016 | Petzold |
| 2017/0338230 | A1 | 11/2017 | Tasbas |

* cited by examiner

TERAHERTZ DETECTOR COMPRISED OF P-N JUNCTION DIODE

CROSS-REFERENCE TO RELATED APPLICATIONS

This patent application is a divisional of U.S. patent application Ser. No. 15/484,172 filed Apr. 11, 2017, entitled "TERAHERTZ DETECTOR COMPRISED OF P-N JUNCTION DIODE," the complete disclosure of which is expressly incorporated herein by reference in its entirety for all purposes.

BACKGROUND OF THE INVENTION

The present invention relates generally to the electrical, electronic and computer arts, and, more particularly, to high-frequency detectors.

It has been demonstrated that high-frequency (e.g., terahertz (THz)) detectors based on p-n junction diodes provide certain benefits over diode-connected metal-oxide-semiconductor (MOS) transistors and heterojunction bipolar transistors (HBTs) due to their higher corner frequency, $f_c$. Flicker noise, also referred to as 1/f noise, is often characterized by the corner frequency between the region dominated by the low-frequency flicker noise and the higher-frequency "flat-band" noise. MOS field-effect transistors (MOSFETs) typically exhibit a higher flicker noise and therefore a lower $f_c$ for a given flat-band noise, compared to junction field-effect transistors (JFETs) or bipolar transistors. The higher flicker noise in MOSFETs is often attributed to the presence of interface states between the gate dielectric and the channel of the transistor.

A higher $f_c$ allows the detector to achieve higher signal-to-noise ratio (SNR), which in turn provides a higher operation frequency. However, an upper limit of the operation frequency is still dictated, to a large extent, by an effective path length for carrier diffusion and an effective series resistance of the diode.

BRIEF SUMMARY

Principles of the invention, in accordance with one or more embodiments thereof, provide a novel diode structure that substantially reduces an effective path length for carrier diffusion, and substantially reduces an effective series resistance of the diode structure, thus providing a detector that beneficially achieves a higher operation frequency compared to conventional detectors.

In one aspect, an embodiment of the invention includes a method of fabricating a semiconductor detector including: forming a p-n junction diode in an active device layer of a silicon-on-insulator (SOI) substrate, the active device layer being formed on an upper surface of an insulator layer of the SOI substrate, the insulator layer being formed on an upper surface of a carrier substrate of the SOI substrate; removing the carrier substrate to thereby expose the insulator layer; forming a first opening through the insulator layer to access a backside of a first doped region of the p-n junction diode, the first doped region underlying a second doped region of the p-n junction diode, the first doped region having a first conductivity type associated therewith and the second doped region having a second conductivity type associated therewith which is opposite in polarity to the first conductivity type; forming a back contact on a back surface of the first doped region and electrically connecting with the first doped region; forming a conductive interconnect layer on an upper surface of the SOI substrate, the interconnect layer comprising a first top contact providing electrical connection with the second doped region; and forming an electrode of the p-n junction diode in the first opening on the backside of the detector structure, the electrode providing electrical connection with the back contact of the p-n junction diode.

In another aspect, an embodiment of the invention includes a semiconductor device comprising at least one p-n junction diode formed on a silicon-on-insulator (SOI) substrate, the p-n junction diode including first and second doped regions formed in an active device layer of the SOI substrate, the first region being formed on an upper surface of the second doped region and having a first conductivity type associated therewith, the second doped region having a second conductivity type associated therewith, the second conductivity type being opposite in polarity to the first conductivity type. A depletion region is formed at an interface between the first and second doped regions. The p-n junction diode further includes a back contact formed on a back surface of the second doped region and electrically connecting with the second doped region. A conductive interconnect layer is formed on an upper surface of the SOI substrate, the interconnect layer including a first top contact providing electrical connection with the first doped region. An electrode of the p-n junction diode is formed on the backside of the semiconductor device, the electrode providing electrical connection with the back contact.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, one or more embodiments may provide one or more of the following advantages, among other benefits:

substantially lower effective diffusion capacitance;
lower effective series resistance;
substantially higher signal-to-noise ratio;
mechanical flexibility.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative detector devices comprised of p-n junction diodes and applications utilizing such detector devices. It is to be appreciated, however, that the specific structures, circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the device may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 1A:
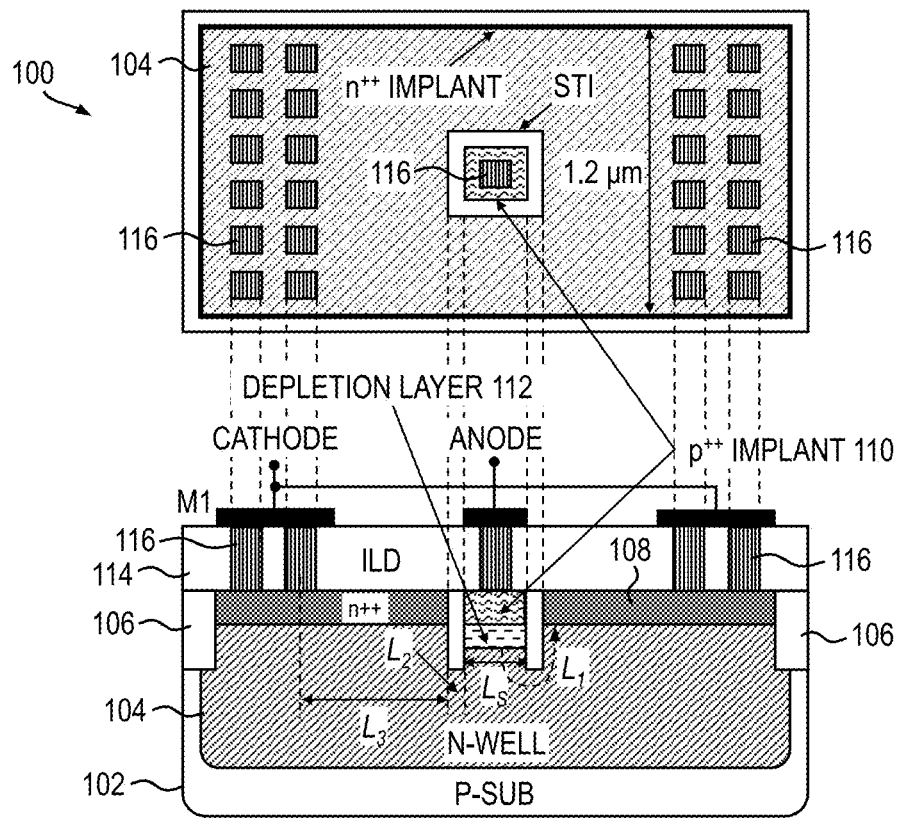
FIG. 1A depicts top plan and cross-sectional views of at least a portion of an exemplary terahertz (THz) detector structure based on a p-n junction diode fabricated using a complementary metal-oxide-semiconductor (CMOS) process.
Figure 1B:
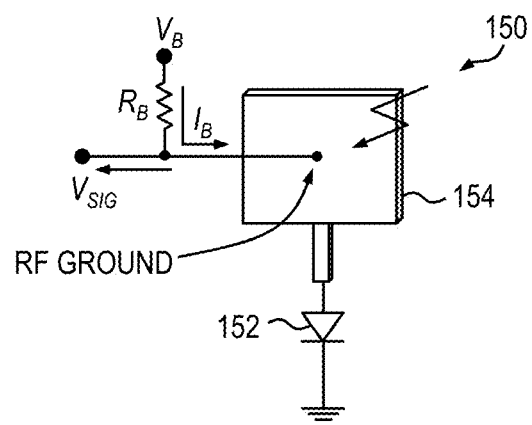
FIG. 1B is a circuit diagram depicting at least a portion of an exemplary detector circuit which uses a p-n junction diode which may be formed in a manner consistent with the p-n junction diode shown in FIG. 1A.

FIGS. 1A and 1B depict at least a portion of an exemplary terahertz (THz) detector structure 100 based on a p-n junction diode fabricated using a complementary metal-oxide-semiconductor (CMOS) process, and a detector circuit 150 employing the p-n junction diode, respectively. Specifically, FIG. 1A depicts top plan (upper) and cross-sectional (lower) views of the detector structure 100. With reference to FIG. 1A, the detector structure 100 includes a substrate 102, which in this embodiment is a p-type substrate (p-sub), and a buried well 104, which in this embodiment is an n-type well (n-well), formed in the substrate. Shallow trench isolation (STI) regions 106 are formed at least partially through the substrate 102 proximate an upper surface of the substrate.

A first implant layer 108, which in this embodiment is an n++ implant layer, is formed on the n-type well 104 between adjacent STI regions 106 proximate the upper surface of the substrate 102. The first implant layer 108 may be formed, for example, using ion implantation of a prescribed dopant (e.g., phosphorous) and doping concentration level, followed by diffusion, as will be known by those skilled in the art. This first implant layer 108 is electrically connected with the n-type well 104 and forms a cathode of the p-n junction diode. A second implant layer 110, which in this embodiment is a p++ implant layer, is formed proximate the upper surface of the substrate between laterally adjacent n++ implant regions 108 and is electrically isolated from the n++ implant regions by STI regions as shown. The second implant layer 110 may be formed, for example, using ion implantation of a known dopant (e.g., boron) and doping concentration level, in a manner consistent with the formation of the first implant layer 108. A depletion layer 112 is formed beneath the second implant layer 110. This second implant layer 110 forms an anode of the p-n junction diode.

An interlayer dielectric (ILD) layer 114 is formed over the upper surface of the structure 100. A plurality of contacts 116 are formed through the ILD layer 114. A first subset of the contacts 116 is electrically connected with the n++ implant layer 108 and form cathode contacts of the device, while a second subset of the contacts is electrically connected with the p++ implant layer 110 and forms the anode contact of the device. A first metal layer (M1) is formed on the ILD layer 114 which serves as interconnect wiring for the device.

FIG. 1B is a circuit diagram depicting at least a portion of an exemplary detector circuit 150 which uses a p-n junction diode 152. The p-n junction diode 152 may, in one or more embodiments, be fabricated in a manner consistent with the illustrative detector structure 100 shown in FIG. 1A. The detector circuit 150 include a patch antenna 154 coupled with an anode of the diode 152, and a cathode of the diode is coupled to ground. A first terminal of a bias resistor, $R_B$, is connected to a node of the patch antenna, which forms a virtual radio frequency (RF) ground, and a second terminal of the bias resistor is connected to a bias voltage source, $V_B$. Using the virtual RF ground induced in the patch antenna directly for DC bias is more efficient for frequencies greater than 1 THz. With this biasing arrangement, a direct current (DC) bias current, $I_B$, equal to $V_B/R_B$, will be supplied to the diode 152 through the patch antenna 154. The patch antenna 154 is adapted to receive a transmitted signal supplied thereto and to generate an output signal, $V_{SIG}$, at an output of the detector circuit 150.

In FIG. 1A, certain device dimensions are labeled. For example, $L_1$ represents hole diffusion path length, $L_2$ represents a thickness of the STI region surrounding the anode of the p-n junction diode (i.e., a thickness of the STI region separating the n++ cathode from the p++ anode implant layers), $L_3$ represents cathode contact separation, and $L_S$ represents anode width. In this exemplary embodiment, $L_1$=0.4-0.5 µm, $L_2$=0.16 µm, $L_3$=0.89 µm, and $L_S$=0.2 µm. These dimensions, along with n-well sheet resistance, $R_{sh,nw}$, (e.g., 585 ohms/square in this embodiment), will affect one or more characterization parameters of the device. For example, hole diffusion path length $L_1$ and n-well sheet resistance $R_{sh,nw}$ are critical design parameters influencing the operational frequency of the p-n junction diode. Thus, although the performance of THz detectors based on p-n junction diodes may be advantageous due to lower noise, the detection frequency is limited by diffusion path length and series (sheet) resistance of the n-well.

In order to achieve a detector having superior high-frequency performance while maintaining the superior low-noise performance of a p-n junction diode, aspects of the present invention provide a novel diode structure that substantially reduces an effective path length for carrier diffusion, and substantially reduces an effective series resistance. FIGS. 2-10 are cross-sectional views depicting various illustrative process stages in the fabrication of an exemplary THz detector structure 200, according to an embodiment of the invention.

Figure 2:
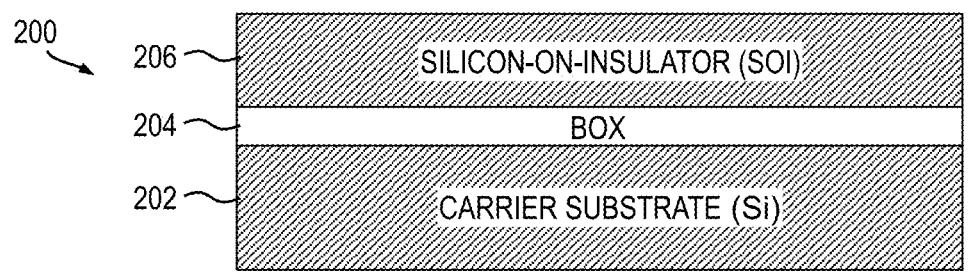
FIGS. 2-10 are cross-sectional views depicting various stages of an illustrative semiconductor fabrication process in the formation of an exemplary THz detector structure, according to an embodiment of the present invention.

With reference now to FIG. 2, the detector structure 200 starts with a silicon-on-insulator (SOI) substrate comprising a carrier substrate 202, which in this embodiment is formed of silicon (e.g., silicon wafer), an oxide or other insulating layer 204 formed on at least a portion of an upper surface of the carrier substrate, and an active device layer 206, which in this embodiment is a silicon (SOI) layer, formed on at least a portion of an upper surface of the oxide layer. The active device layer may have a prescribed conductivity type (e.g., n-type or p-type) associated therewith, such as by using a standard doping process. In this illustrative embodiment, the active device layer 206 is of n-type conductivity (e.g., using a phosphorous dopant). Since the oxide layer 204 is formed between the two silicon layers 202, 206 it is often referred to as a buried oxide (BOX) layer. The SOI layer 206, buried oxide layer 204 and carrier substrate 202 are considered elements of the SOI substrate.

Figure 3:
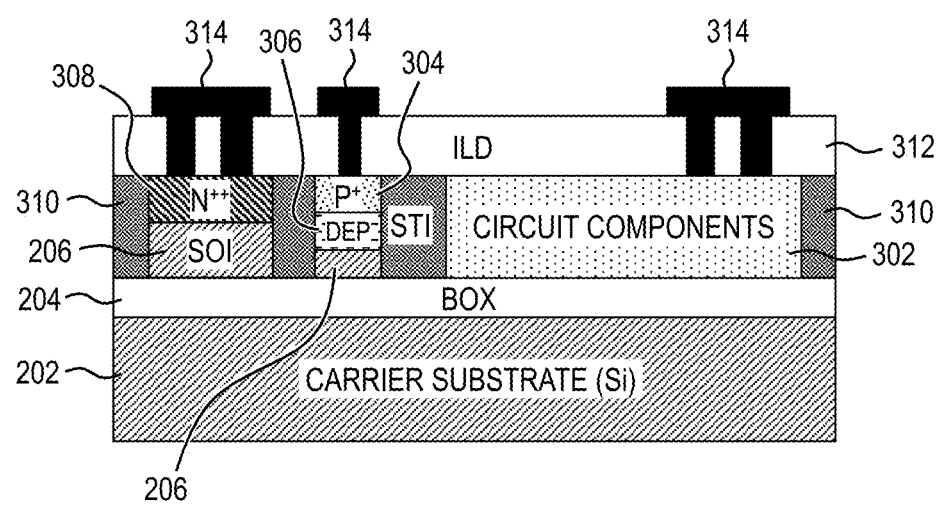

As shown in FIG. 3, circuit components 302, which may include, for example, transistors, peripheral devices, circuits, sub-circuits, antenna (e.g., patch antenna), etc., are fabricated in the SOI layer 206 using techniques known in the art (e.g., standard photolithographic processing). A p-n junction diode of the detector is also formed in the SOI layer 206. The p-n junction diode comprises a first doped region 304, formed on an upper surface of the SOI layer 206. The first doped region 304, in this embodiment, is a heavily-doped $p^+$ region, which may be formed using known techniques, such as, for example, ion implantation of a p-type impurity (e.g., boron) of a prescribed concentration level. Implantation is then followed by rapid thermal annealing (RTA) or pulsed laser annealing, or an alternative diffusion process, to form a shallow p+/n junction with the underlying n-doped SOI layer 206. The p+ region 304 will form an anode of the p-n junction diode and the n-doped SOI layer 206 underlying the p+ region will form a base of the diode.

Region 306 represents a depletion region of the p-n junction diode which forms at an interface between the p+ region 304 and underlying n-doped SOI layer 206. The depletion region 306 defines an area of the n-doped SOI layer 206 which has been depleted of free charge carriers, caused at least in part by its proximity to the $p^+$ region 304. A depth of the depletion region 306 can be increased or decreased as a function of the polarity and/or magnitude of an applied bias (positive bias on an anode with respect to a cathode of the p-n junction diode decreases the width, whereas negative bias increases the width). The depleted portion of the p+ region 304 is negligible due to its high doping concentration, as known in the art, and therefore not illustrated for simplicity.

Alternatively, the $p^+$/n junction may be formed by epitaxial growth; for example epitaxial growth of $p^+$ hydrogenated crystalline silicon (c-Si:H) with 5-40 atomic % hydrogen using, for example, plasma-enhanced chemical vapor deposition (PECVD), at temperatures below 400° C., and more preferably below 200° C., to form an abrupt shallow junction. The hydrogen content in the hydrogenated crystalline silicon may or may not be uniform. For example, in one or more embodiments, the hydrogen content has a gradient towards the c-Si:H/Si interface. In one or more embodiments, the PECVD silicon may additionally contain one or more elements, such as, but not limited to, deuterium (D), fluorine (F), chlorine (Cl), carbon (C), germanium (Ge), oxygen (O) and nitrogen (N). Furthermore, in one or more embodiments, hot-wire chemical vapor deposition (HW-CVD) may be used instead of PECVD.

The hydrogenated crystalline silicon (c-Si:H) containing layer may be grown from a mixture of a precursor gas, such as silane ($SiH_4$) or other gases of the $Si_xH_y$ family, such as disilane (although fluorine-containing and/or chlorine-containing precursors may be used as well (e.g., $SiF_4$ or $H_2SiCl_2$), and combinations thereof), a carrier gas (e.g., $H_2$) and a dopant gas, such that $[H_2]/[SiH_4]>5$ in a PECVD reactor. For n-type doping, the dopant gas may include, for example, phosphine ($PH_3$). For p-type doping, the dopant gas may include diborane ($B_2H_6$) or trimethylborane, $B(CH_3)_3$.

A heavily-doped n-type region 308 (n++) is preferably formed on a portion of the n-type SOI layer 206, spaced laterally and electrically isolated from the p+ region 304. The n++ region 308 and underlying SOI layer 206 is one convenient method of connecting a top metal interconnect (e.g., 314) to a bottom electrode metal (e.g., 1002 in FIG. 10) so that the cathode of the p-n junction diode can be accessed from an upper surface of the substrate. In other embodiments, the bottom electrode metal can be connected directly to the top metal interconnect, for example through an opening formed in a shallow trench isolation (STI) structure, as will be described in further detail in conjunction with FIGS. 11-18.

In order to electrically isolate active devices formed in the SOI substrate, a plurality of STI structures 310 are preferably formed in the SOI layer 206 proximate the upper surface of the substrate and extending vertically through the SOI layer to the buried oxide layer 204. An interlayer dielectric (ILD) layer 312, or alternative insulating layer, is preferably formed over an upper surface of the SOI substrate 206 as shown. The ILD layer is comprised of dielectric material used to electrically separate closely spaced interconnect lines, such as interconnect and/or contact metallization 314, typically arranged in several levels (in a multi-level metallization process) in advanced integrated circuits; ILD generally features a low dielectric constant (low-k), for example as close to 1 as possible, to minimize capacitive coupling (e.g., crosstalk) between adjacent metal lines. The contact metallization 314 provides electrical connection to the n++ region 308, forming a top cathode contact of the p-n junction diode as previously stated, and the p+ region 304, forming the anode contact of the p-n junction diode, as well as providing electrical connection to one or more other circuit components 302 formed in the SOI substrate. It will be appreciated that in other embodiments, multiple ILD and metallization levels may be used as is customary in the fabrication of integrated circuits, and as such the electrical connections to the n++ region 308, p+ region 304 and one or more circuit components 302 may be obtained using contact metallization from different metallization levels.

Figure 4:
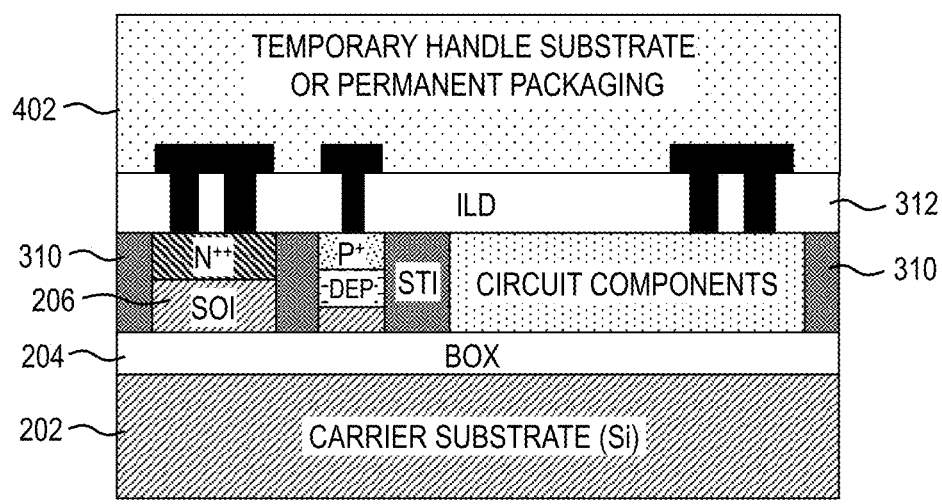

With reference now to FIG. 4, the SOI substrate is bonded to either a temporary handle substrate 402, which is subsequently removed before packaging, or a permanent packaging, which may comprise through-silicon or through-glass vias, silicon interposers, etc., as known in the art. The handle substrate 402, in one or more embodiments, comprises silicon or glass, although embodiments of the invention are limited to such materials. In some embodiments, the handle substrate 402 comprises a mechanically flexible material such as plastic or dielectric-coated metal foil.

Figure 5:
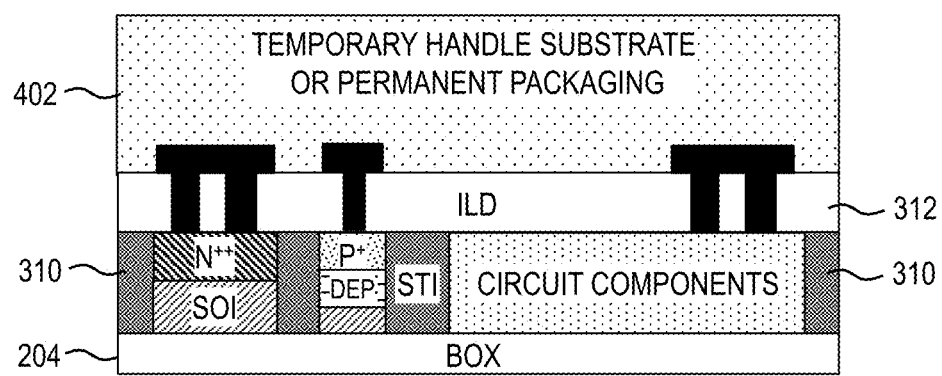

As shown in FIG. 5, the carrier substrate (202 in FIG. 4) is removed using techniques known in the art, such as, for example, mechanical grinding or controlled spalling technology (CST)—in the latter case, the handle substrate is chosen to be flexible and may also contain a stressor layer, as known in the art, followed by chemical etching. In one or more embodiments, the etchant used in the chemical etching is selective to silicon (or other material used to form the carrier substrate), and the buried oxide layer 204 is used as an etch-stop layer so that etching halts when the buried oxide layer is reached. Tetra-methyl-ammonium-hydroxide (TMAH) or potassium hydroxide (KOH) solution is used as an etchant in one or more embodiments, although the invention is not limited to any specific etchant. Reactive-ion-etching (ME) using, for example, $SF_6/O_2$, $SF_6/CHF_3$, $SF_6/CCl_2F_2$ or $CF_4$, may also be used in some embodiments.

Figure 6:
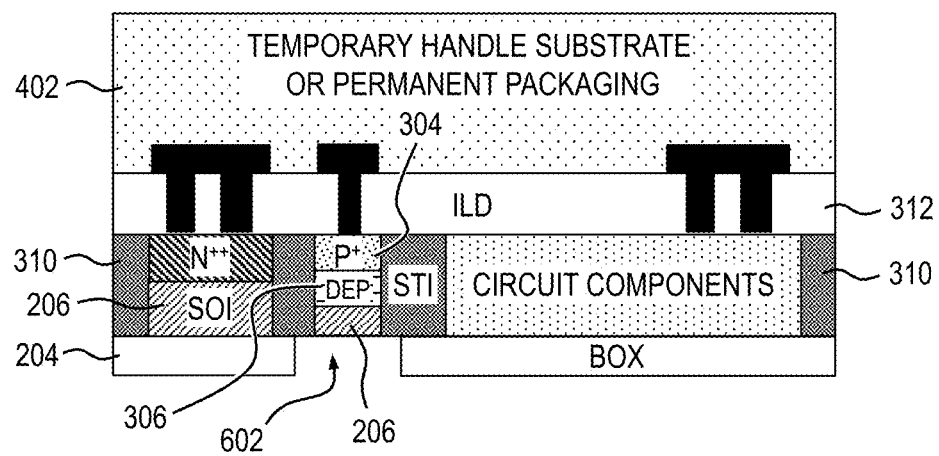

In FIG. 6, once the carrier substrate (202 in FIG. 4) has been removed, thereby exposing the buried oxide layer 204, a first via 602 is opened through the buried oxide layer to access a backside of the detector (p-n junction diode cathode), using fabrication techniques known in the art, such as, for example, standard lithography and etching. Specifically, the via 602 is formed through the buried oxide layer 204 to expose a backside surface of at least a portion of the n-doped SOI layer 206 on which the p+ region 304 and depletion region 306 are formed.

Figure 7:
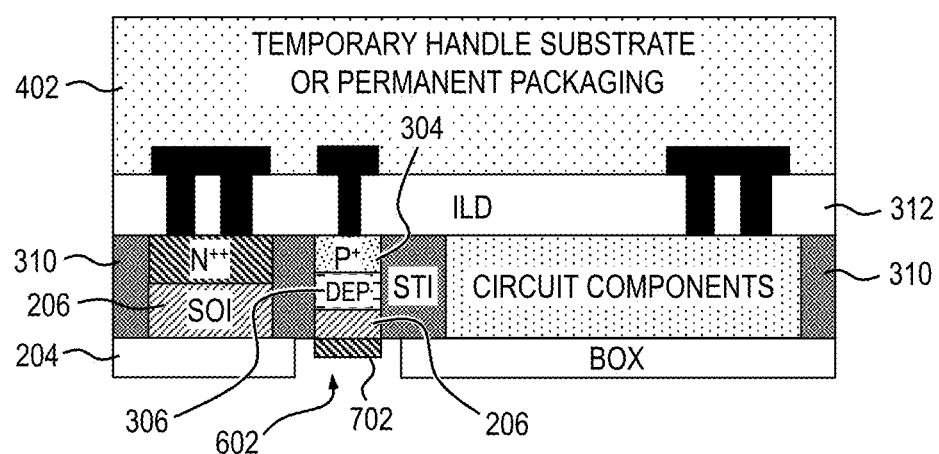

A back contact (cathode) 702 of the detector (p-n junction diode) is formed on the backside of the SOI layer 206 within via 602, as shown in FIG. 7. More particularly, in one or more embodiments, the back contact 702 of the detector is formed by epitaxial growth of $n^+$-doped hydrogenated crystalline silicon ($n^+$ c-Si:H) with 5-40 atomic % hydrogen using e.g. PECVD, at temperatures below 400° C., and more preferably below 200° C., in a manner consistent with the formation of the n++ region 308 shown in FIG. 3 and previously described. This back contact 702 forms a bottom cathode contact region of the p-n junction diode, in this illustrative embodiment. The amorphous portion of hydrogenated silicon (a-Si:H) grown on the exposed backside of the STI structures 310 through via 602 may be removed using selective etching, leaving behind the crystalline portion (as illustrated) for example using $H_2$ plasma which may be applied in-situ. Alternatively (not explicitly shown, but implied), the grown $n^+$-doped hydrogenated Si ($n^+$ Si:H) layer may be patterned either using an additional mask (which will leave $n^+$ a-Si:H on at least a portion of the bottom surface of the exposed STI) or using bottom contact metal of a subsequent process step (described below) as a hard mask (which will leave $n^+$ a-Si:H on the entire exposed bottom surface of the STI, sidewalls of BOX in via 602, and on a portion of the backside surface of BOX covered by the bottom metal contact 1002).

In embodiments where selective etching is performed, hydrogenated amorphous silicon may be etched selectively with respect to hydrogenated crystalline silicon, with selectively in a range of about 3:1 to 10:1; in one or more other embodiments, the selectivity is greater than about 10:1. Furthermore, in embodiments where selective etching is performed, the selective etching may be performed in hydrogen plasma, for example in-situ; that is, in the same reactor where hydrogenated silicon (Si:H) has been grown. In accordance with one or more other embodiments, a wet etch, such as, for example, dilute KOH (~1M or below) or dilute HF (<5% is DI water), is used. In some embodiments the hydrogenated crystalline silicon layer may contain germanium (Ge); that is, comprised of c-SiGe:H, wherein Ge is introduced from a gas mixture containing a precursor such as $GeH_4$, wherein $[H_2]/([SiH_4]+[GeH_4])>5$.

Figure 8:
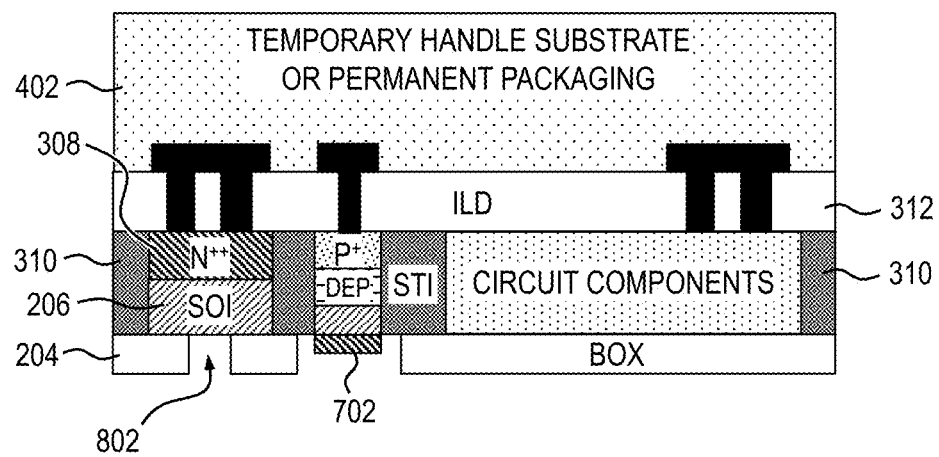
Figure 9:
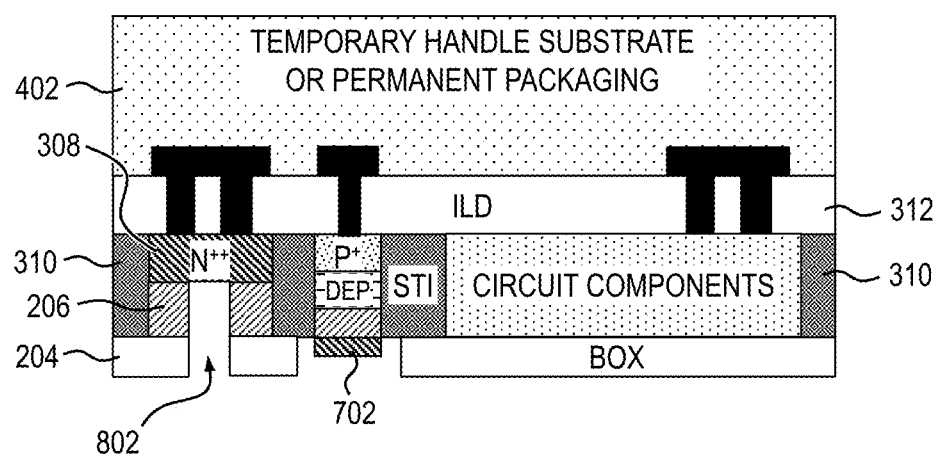

As previously stated, the n++ region 308 provides access to the back contact (cathode) 702. With reference now to FIG. 8, a second via 802 is opened through the buried oxide layer 204 (and n+ a-Si:H when present on BOX, e.g. in embodiments where bottom contact metal 1002 is used as a hard mask for patterning n+ Si:H instead of selective etching, as described earlier) to expose a backside of at least a portion of the SOI layer 206 directly beneath and proximate to the highly-doped n++ region 304. In this manner, the via 802 and n++ region 308 provide access to an area designated to electrically connect to a back electrode (a cathode back contact, in this embodiment) of the detector. To accomplish this, the via 802 is further etched through the exposed SOI layer 206 to access the highly-doped $n^{++}$ region 308, as shown in FIG. 9. This may be accomplished, in one or more embodiments, using a selective wet-etch, such as, for example, tetramethylammonium hydroxide (TMAH) or KOH, or timed etching, such as, for example, reactive ion etching (RIE).

Figure 10:
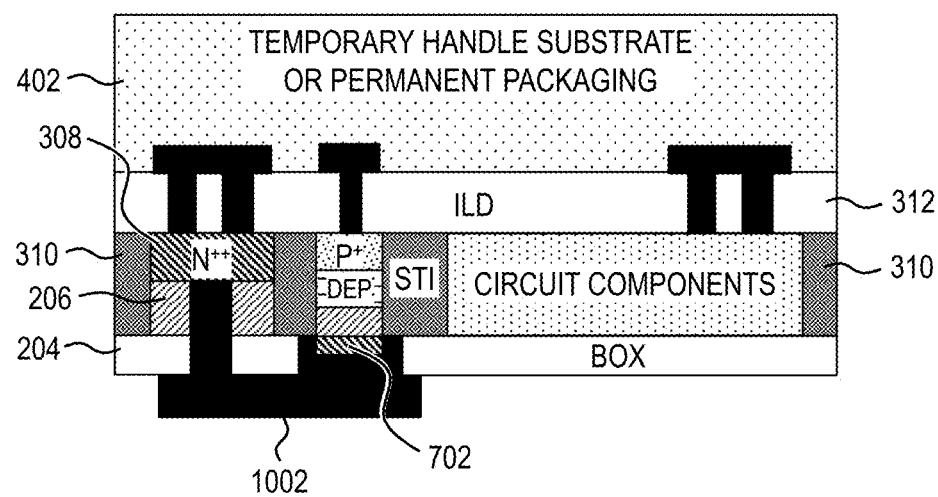

FIG. 10 illustrates a metallization step, wherein metal is deposited in the first and second vias 602 and 802, respectively, to form a cathode back electrode 1002 of the detector. More particularly, the cathode back electrode 1002 is electrically connected with the $n^{++}$ region 308 and the back contact (cathode) 702 of the detector. In embodiments where the back electrode 1002 is used as a hard mask for patterning $n^+$Si:H instead of selective etching, the portion of $n^+$ a-Si:H on the back surface of BOX not covered by the back electrode 1002 may be etched at this stage. In one example, RIE e.g. with $SF_6/CHF_3$, $CCl_2F_2/O_2$ or $CF_4$ may be used for this purpose.

Optionally, a low-temperature annealing step may be used to improve ohmic contact and/or silicide formation. In a silicide process, silicide contacts are formed only in those areas in which deposited metal (which after annealing becomes a metal component of the silicide) is in direct contact with silicon (e.g., n++ region 308 and back contact 702, both of which are formed of doped silicon), hence, the process is self-aligned. The temperature and/or duration of the anneal step is preferably limited so as to prevent substantial out-diffusion of hydrogen from the c-Si:H layer(s).

If a temporary handle substrate 402 has been used, it may be removed at this stage after attaching the structure to a second (temporary or permanent) handle substrate on an opposite side of the buried oxide layer 204. Packaging using standard techniques may follow, as will become apparent to those skilled in the art.

Rather than forming a conductive path between the top and bottom surfaces of the SOI layer using the heavily-doped n++ region 308 and underlying portion of the n+ SOI layer 206, as shown in FIG. 10, the detector structure can utilize a direct connection between the cathode back electrode 1002 and the metal interconnect layer (contact metallization) 314, according to an alternative embodiment. Specifically, FIGS. 11-18 are cross-sectional views depicting various stages of an illustrative semiconductor fabrication process in the formation of an exemplary THz detector structure 1100, according to another embodiment of the invention.

Figure 11:
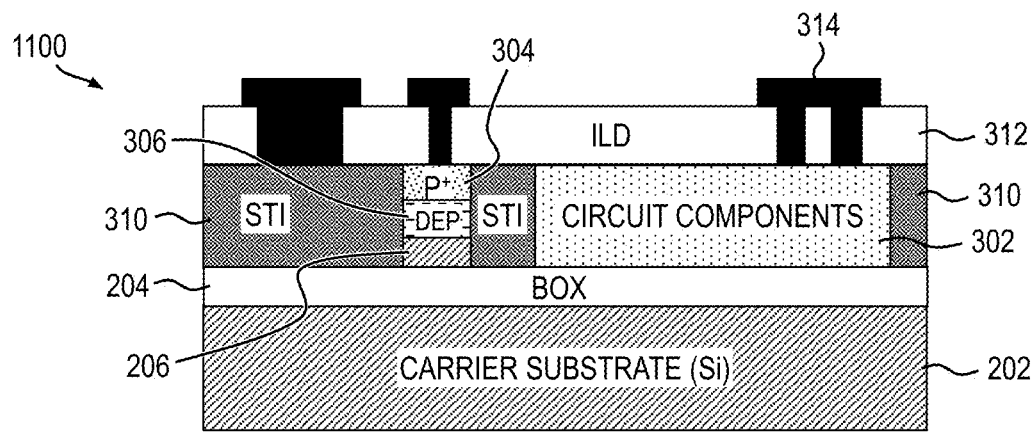
FIGS. 11-18 are cross-sectional views depicting various stages of an illustrative semiconductor fabrication process in the formation of an exemplary THz detector structure, according to another embodiment of the present invention.

As shown in FIG. 11, the detector structure 1100 is fabricated on an SOI substrate comprising a carrier substrate 202, a buried oxide (BOX) or other insulating layer 204 formed on an upper surface of the carrier substrate, and an active silicon device (SOI) layer 206 formed on an upper surface of the buried oxide layer 204. Circuit components 302, which may include, but are not limited to, transistors, peripheral devices, circuits, sub-circuits, antenna (e.g., patch antenna), etc., are fabricated in the SOI layer 206, as previously stated. A p-n junction diode of the detector is also formed in the SOI layer 206. The p-n junction diode includes the first doped region 304, which, in this embodiment, is a heavily-doped p$^+$ region, formed on the upper surface of the n-doped SOI layer 206 using known techniques. The p+ region 304 will form an anode of the p-n junction diode and the n-doped SOI layer 206 underlying the p+ region will form a base of the diode.

As previously described in connection with FIG. 3, the p-n junction of the detector is formed using standard integrated circuit fabrication techniques, such as ion implantation followed by rapid thermal annealing or pulsed laser annealing to form a shallow junction. Alternatively, the p-n junction may be formed by epitaxial growth of p+c-Si:H with 5-40 atomic % hydrogen using, for example, PECVD at temperatures below 400° C., and more preferably below 200° C., to form an abrupt shallow junction.

A plurality of STI structures 310 are preferably formed in the SOI layer 206 proximate the upper surface of the substrate and extending vertically through the SOI layer to the buried oxide layer 204. An interlayer dielectric (ILD) layer 312, or alternative insulating layer, is preferably formed over an upper surface of the SOI substrate 206 as shown and is used to electrically separate closely spaced interconnect lines, such as interconnect and/or contact metallization 314. The contact metallization 314 provides electrical connection to the circuit components 302, as well as the p-n junction diode, formed in the SOI substrate. As previously described with respect to FIG. 3, multiple ILD 312 and metallization 314 levels may be used in some embodiments.

Figure 12:
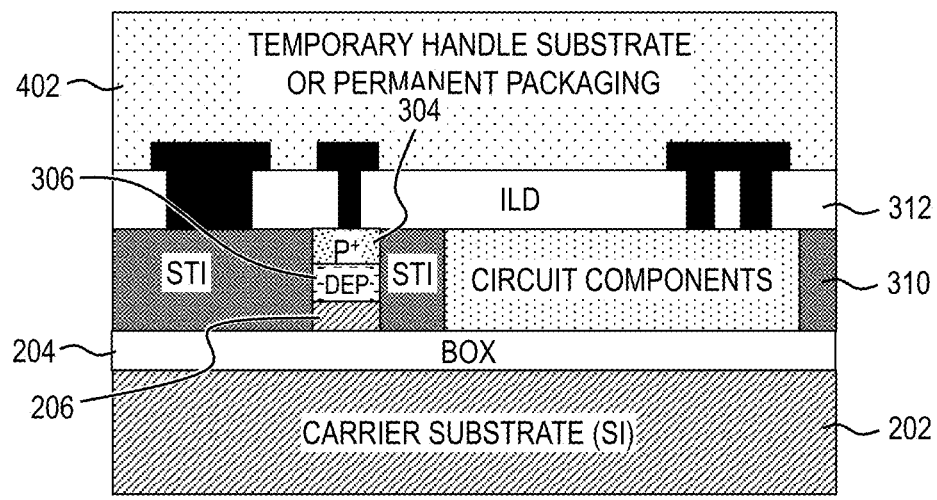
Figure 13:
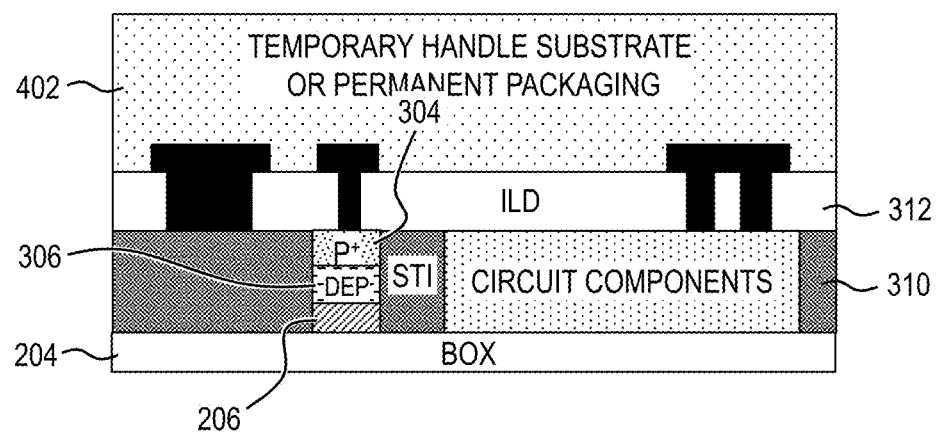

As depicted in FIG. 12, the substrate is preferably bonded to either a temporary handle substrate 402 which is subsequently removed prior to packaging, or a permanent packaging comprised of through vias, as will be known in the art. The carrier substrate 202 is then removed using techniques known in the art, such as, e.g., mechanical grinding or controlled spalling (in the latter case, the handle substrate is chosen to be flexible and may also contain a stressor layer), followed by chemical etching of the silicon, selectively stopping on the buried oxide layer 204. The resulting structure is shown in FIG. 13.

Figure 14:
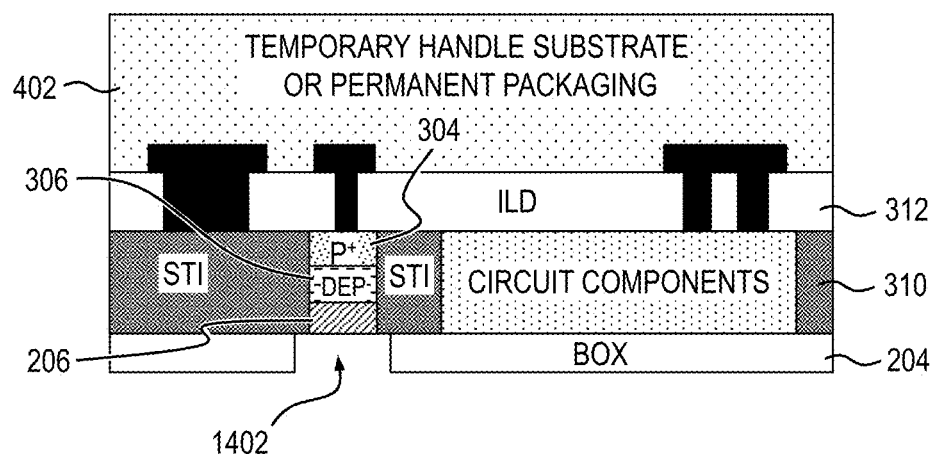
Figure 15:
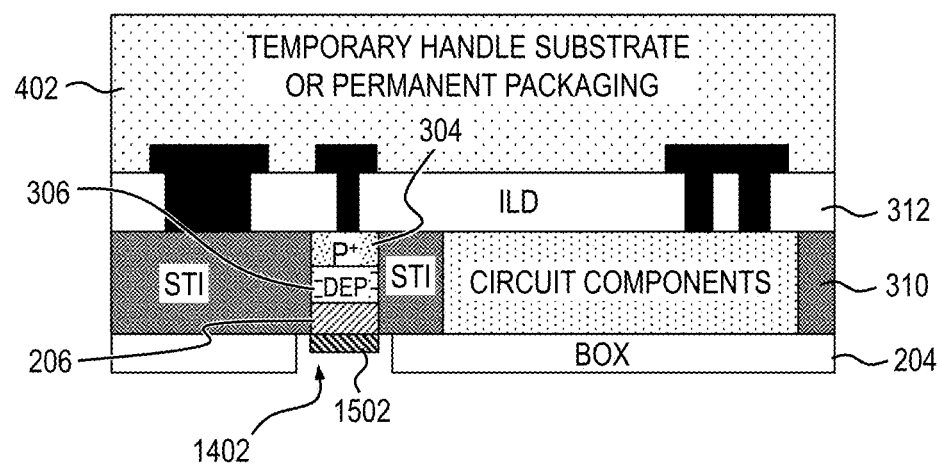

With reference to FIG. 14, a via 1402 is opened in the buried oxide layer 204, through a back surface thereof, to access a backside of the n-doped SOI layer 206 underlying the depletion region 306. The via 1402 is formed, in one or more embodiments, using known techniques, such as, for example, standard lithography and etching. A back contact 1502 of the detector is formed in the via 1402, as shown in FIG. 15. In one or more embodiments, the via 1402 is wider than the back contact 1502, so that conductive material deposited in the via during a subsequent processing step surrounds sidewalls of the back contact 1502, thereby reducing an electrical resistance between the back cathode electrode (see FIG. 18) and the back contact 1502. The back contact 1502 provides electrical connection with the n-doped SOI layer (base region) 206 underlying the depletion region 306 and forms the cathode of the p-n junction diode.

In one or more embodiments, the back contact 1502 is formed by epitaxial growth of n+ c-Si:H with 5-40 atomic % hydrogen using, for example, PECVD at temperatures below 400° C., and more preferably below 200° C. Like in the formation of the back contact 702 shown in FIG. 7, the amorphous portion of Si:H grown on the back surface of the STI structures 310 exposed through the via 1402 may be removed in-situ, for example using H2 plasma (as illustrated in FIG. 15). Alternatively, n+ Si:H may be subsequently patterned, for example using a separate lithography mask or using the bottom contact metal of a succeeding metal deposition step as a hard mask.

Figure 16:
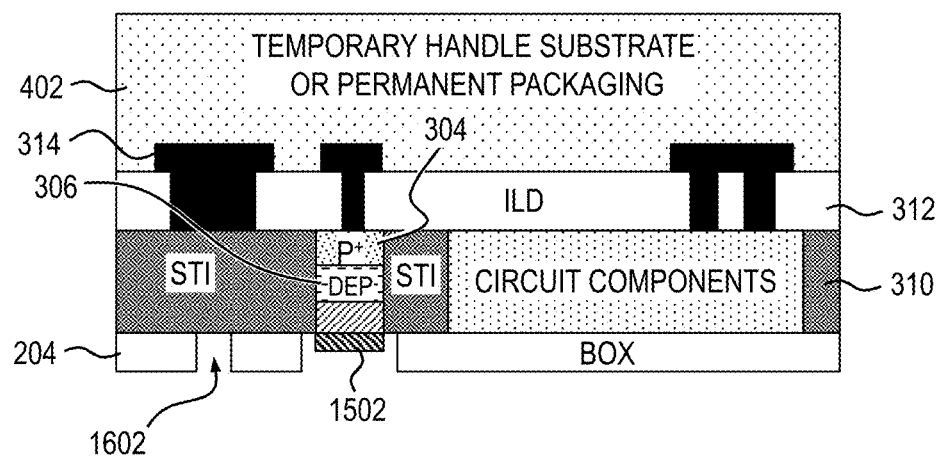
Figure 17:
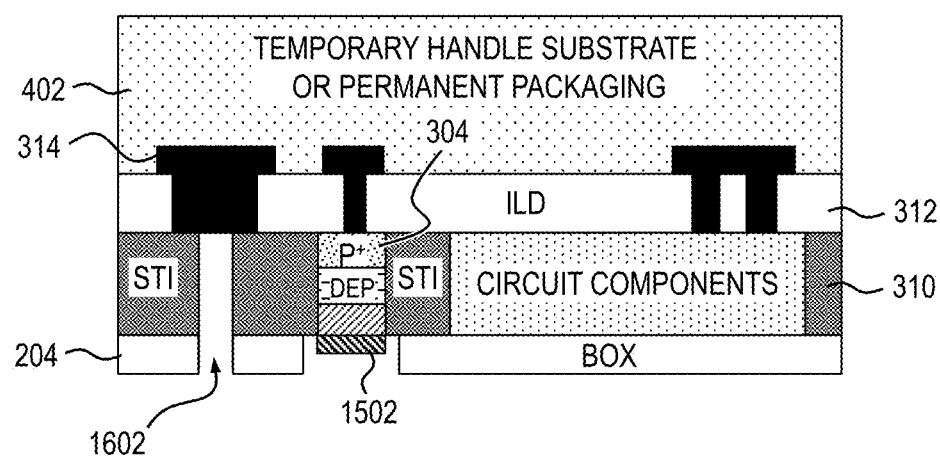

In FIG. 16, a second via 1602 is opened through the buried oxide layer 204 to expose a portion of the STI structure 310 directly underneath a corresponding portion of the metal interconnect 314 forming a top cathode contact of the p-n junction diode. The via 1602 is further etched through the STI structure 310, as shown in FIG. 17, to expose the underside of the upper metal interconnect 314 ultimately forming the top cathode contact of the p-n junction diode. This may be accomplished, for example, by selective RIE (e.g., a $CF_4/O_2$ plasma), or an alternative etching process.

Figure 18:
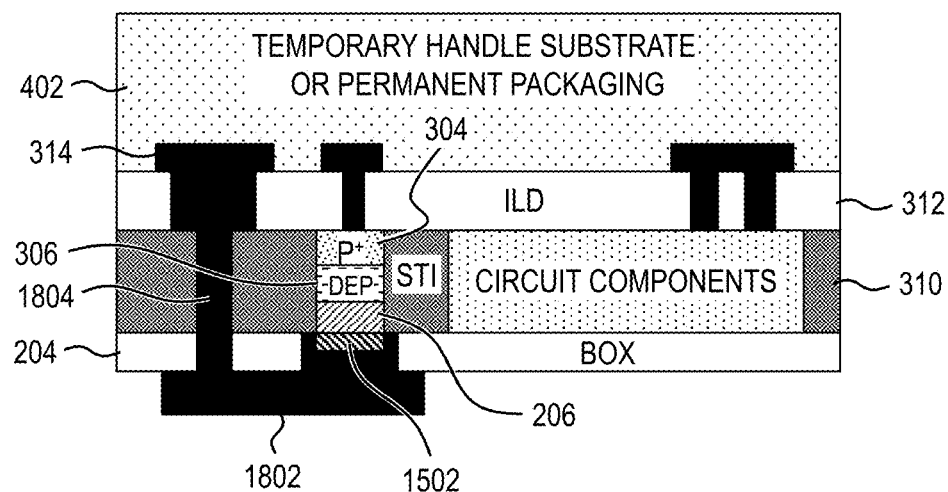

FIG. 18 illustrates a metallization process used to form a back cathode electrode 1802 of the detector. The metal deposited in the via 1602 forms a conductive structure (e.g., pillar) which electrically connects the back cathode electrode 1802 of the detector with the overlying top metal interconnect 314 to form the top cathode contact of the detector. In this manner, the embodiment shown in FIG. 18 eliminates the need to form a heavily-doped n++ region 308 for providing electrical connection between the top and back surfaces of the active device layer 206.

Optionally, in one or embodiments, a low-temperature annealing step may be used to improve ohmic contact and/or silicide formation, as previously described in connection with FIG. 10. The temperature and/or duration of the anneal step is limited to prevent substantial out-diffusion of hydrogen from the c-Si:H layer(s). In one example, 50% of the hydrogen content of c-Si:H is lost during an annealing time of approximately 25 hours at an annealing temperature of 350° C., therefore the annealing time is limited to 2-3 hours. In another example, 50% of the hydrogen content of c-Si:H is lost during an annealing time of approximately 30 minutes at an annealing temperature of 500° C., therefore the annealing time is limited to 30 minutes. In yet another example, 50% of the hydrogen content of the hydrogenated silicon containing material is lost during an annealing time of approximately 5 minutes at an annealing temperature of 600° C.

If a temporary handle substrate has been used, it may be removed at this stage after attaching the structure to a secondary (temporary or permanent) handle substrate on the opposite (BOX) side. Packaging using standard techniques known in the art may then follow.

Figure 19:
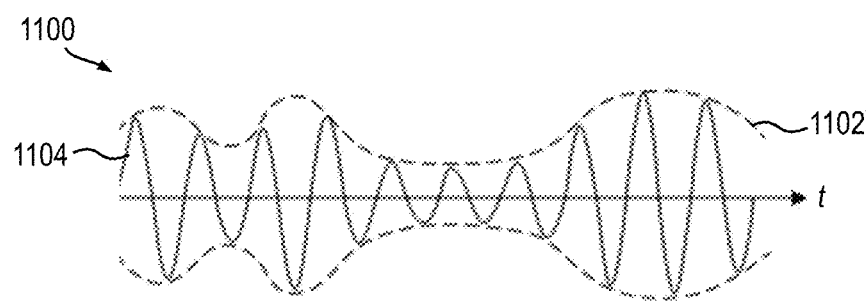
FIG. 19 is a conceptual view depicting an illustrative waveform of an exemplary incidental signal which may be received by the exemplary detector circuit shown in FIG. 1B.

Consider the exemplary detector circuit 150 employing a p-n junction diode 152 shown in FIG. 1B. The output signal $V_{SIG}$ generated by the detector circuit 150 may be supplied to an input of a low-noise amplifier (narrow band), or other sensitive circuitry coupled with the detector circuit. In this illustration, an incident signal is received by the patch antenna 154. Furthermore, consider an incident signal 1900 having a waveform as depicted in FIG. 19. The incident signal 1900 includes an information signal 1902 and a carrier signal 1904, with the information signal having a frequency that is substantially lower than the carrier frequency. By way of example only and without limitation, assume the information signal 1902 is in an RF frequency range and the carrier signal is in a THz frequency range.

Several parameters of the diode 152 used in the detector circuit 150 will affect the high-frequency operation of the circuit. Such parameters include, among other factors, junction capacitance, $C_j$, diffusion capacitance, $C_{diff}$, depletion capacitance, $C_{dep}$, diode current, $I_D$, and hole transit time, $\tau_p$. A relationship between these parameters and frequency can be expressed as follows:

$$\begin{cases} C_j = C_{dep} + C_{diff} \\ C_{diff} = \dfrac{qI_D}{kT}(\tau_p/2\omega) \end{cases}$$

where k is Boltzman's constant, T is junction temperature (in degrees Kelvin), and the quantity kT/q is referred to as the thermal voltage of the p-n junction (approximately 26 mV at room temperature).

For high-frequency operation of the detector, it is desirable to reduce the diffusion capacitance $C_{diff}$. However, the diode current $I_D$ is preferably sufficiently large (e.g., at least 10 times higher than the background noise current, in some preferred embodiments). If $I_D$ is reduced in order to reduce the diffusion capacitance, the noise fed into the low-noise amplifier reduces the signal-to-noise ratio or may completely obscure the signal. Thus, an important advantage of embodiments of the invention is that diffusion capacitance is significantly reduced by the novel p-n junction diode structure (e.g., FIG. 10), and such reduction is independent of diode current.

By way of illustration only, consider the following expression: $\tau_p = L_{p,eff}^2/D_p$, where $L_{p,eff}$ is the effective path length for hole diffusion and $D_p$ is the diffusion coefficient for holes. Conventionally, $L_{p,eff}$ is approximately 0.4-0.5 μm, given that $\tau_p = \sim100$ ps (See, e.g., Z. Ahmad, et. al., "THz Detection Using p+/n-Well Diodes Fabricated in 45-nm CMOS," *IEEE Elect. Dev. Lett.* vol. 37, no. 7, pp. 823-826, 2016, incorporated by reference herein). By comparison, $L_{p,eff}$ for the diode structure formed in accordance with embodiments of the invention is determined by SOI thickness; that is, about 20-50 nm, in one or more embodiments. Therefore, $C_{diff}$ is beneficially reduced by at least a factor of one hundred times using the novel diode structure according to embodiments of the invention.

As a secondary advantage, the novel diode structure according to embodiments of the invention is a reduction in series resistance, $R_S$, of the device. By way of illustration only, $R_S$ is typically about 210 ohms (Ω) for a diode area A=0.12 μm² and $N_D = 2 \times 10^{17}$ cm⁻³. By comparison, in accordance with embodiments of the invention, for the same diode parameters A and $N_D$ as above, SOI thickness less than about 50 nm will be fully depleted ($W_D = \sim 50$ nm at $V_D = 0.7V$), therefore $R_s$, will depend on the contact resistance. If specific contact resistance is less than about $2 \times 10^{-7}$ Ω·cm², which is reasonable to achieve, then $R_s < 210\Omega$ can be attained. Using the diode structure according to embodiments of the invention, for the same diode area A as above and $N_D = 2 \times 10^{18}$ cm⁻³ $W_D = \sim 15$ nm at $V_D = 0.7V$, therefore for 50 nm SOI, calculated $R_s \approx 16\Omega$. In order for the contact resistance to not dominate, specific contact resistance should be less than about $2 \times 10^{-8}$ Ω·cm², which is still attainable.

Figure 20:
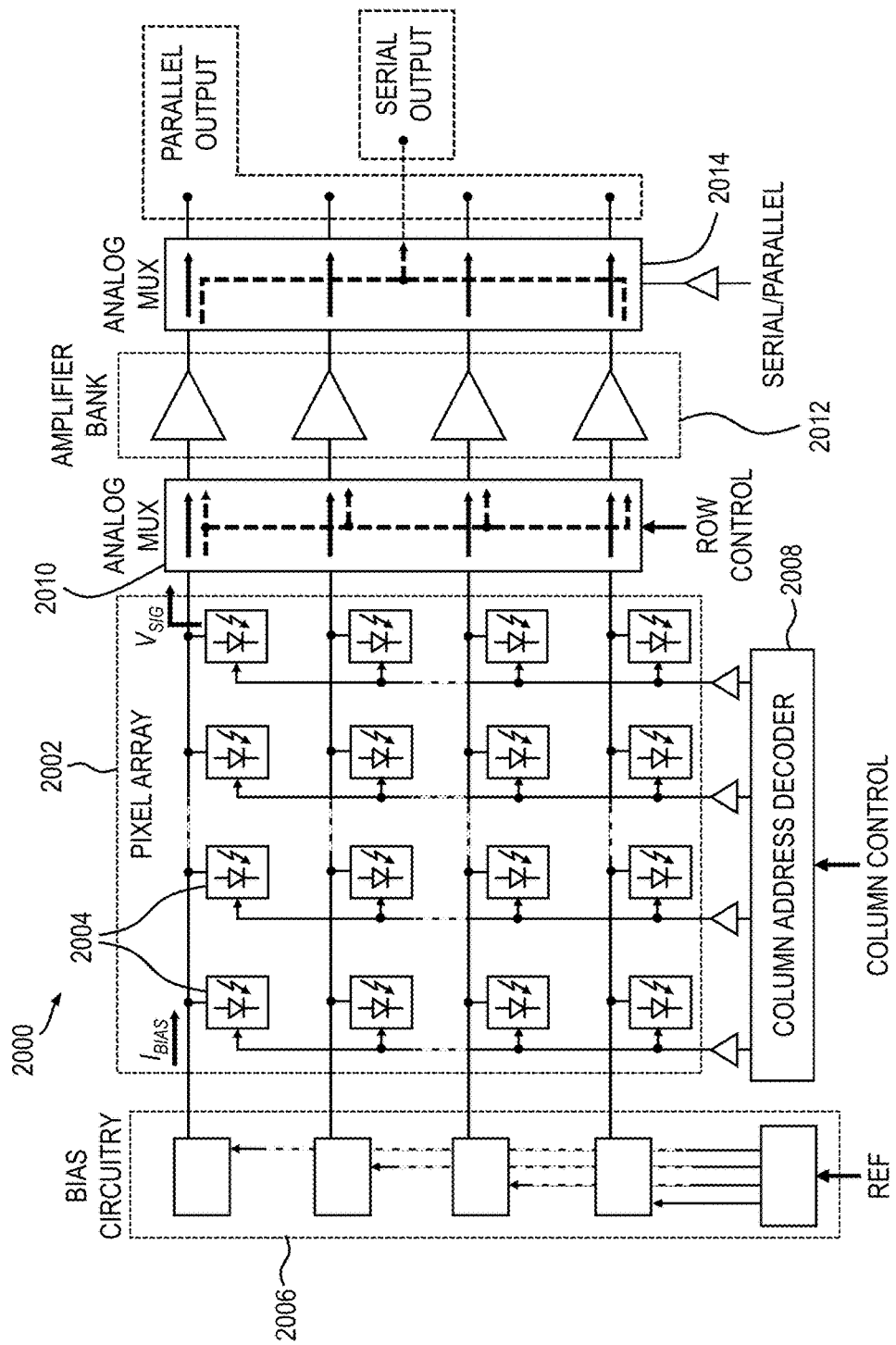
FIG. 20 is a schematic diagram depicting at least a portion of an exemplary array-based detection circuit in which aspects of the present invention may be employed, according to an embodiment of the present invention.

FIG. 20 is a schematic diagram depicting at least a portion of an exemplary detection circuit 2000 in which aspects of the present invention may be employed, according to an embodiment of the invention. The detection circuit 2000 utilizes a pixel array 2002 comprising a plurality of detectors 2004 arranged in a grid configuration, with each detector connected to a unique column and row pair as shown. Each of at least a subset of the detectors 2004 comprises a detector fabricated in accordance with one or more embodiments of the invention. Bias circuitry 2006 coupled to the pixel array 2002 supplies a bias current, $I_{BIAS}$, to each of the rows of detectors 2004, as a function of at least one reference signal, REF, supplied to the bias circuitry.

A column address decoder 2008 is included in the circuit 2000 which is connected to the pixel array 2002 and is configured to select a given one or more of the columns in the pixel array as a function of at least one column control signal supplied to the column address decoder. Each of the rows of the pixel array 2002 are connected to a first multiplexer (MUX) 2010, which in this embodiment is an analog multiplexer. The first multiplexer 2010 is adapted to receive at least one row control signal for selecting a given one or more of the rows in the pixel array 2002. Thus, a unique combination of column control signal and row control signal is used to select a given one of the detectors 2004 in the pixel array 2002, and an output signal, $V_{SIG}$, generated by a selected detector 2004 is then fed to an input of a corresponding amplifier in an amplifier bank 2012.

An output of each of a plurality of amplifiers in the amplifier bank 2012 is fed to a second multiplexer 2014, which in this embodiment is an analog multiplexer. The second multiplexer 2014 is configured to generate either a serial output, shown in dotted line, or as parallel outputs, shown in solid lines, as a function of a serial/parallel control signal supplied to the second multiplexer 2014.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having high-frequency detector devices, and more particularly high-frequency p-n junction diodes, formed in accordance with one or more embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Relational terms such as "upper," "above," "backside" and "below" are used to indicate relative positioning of elements or structures to each other as opposed to absolute elevation or position.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A semiconductor device comprising at least one p-n junction diode formed on a silicon-on-insulator (SOI) substrate, the p-n junction diode comprising:
   first and second doped regions formed in an active device layer of the SOI substrate, the first doped region being formed on an upper surface of the second doped region and having a first conductivity type associated therewith, the second doped region having a second conductivity type associated therewith, the second conductivity type being opposite in polarity to the first conductivity type;
   a depletion region formed at an interface between the first and second doped regions;
   a back contact formed on a back surface of the second doped region and electrically connecting with the second doped region;
   a conductive interconnect layer formed on an upper surface of the SOI substrate, the interconnect layer comprising a first top contact providing electrical connection with the first doped region;
   an electrode of the p-n junction diode formed on the backside of the semiconductor device, the electrode providing electrical connection with the back contact; and
   a conductive structure formed through the SOI substrate, the conductive structure being electrically isolated from the first doped region and, in conjunction with the electrode, providing electrical connection between the second doped region and a second top contact in the interconnect layer formed on the upper surface of the SOI substrate.

2. The semiconductor device of claim 1, wherein the second doped region comprises epitaxially grown $p^+$-doped hydrogenated crystalline silicon with 5 to 40 atomic percent hydrogen.

3. The semiconductor device of claim 1, wherein the p-n junction diode further comprises shallow trench isolation (STI) structures formed in the active device layer proximate an upper surface of the SOI substrate and extending vertically through the active device layer to the insulator layer, the first and second doped regions being formed between two laterally adjacent STI structures.

4. The semiconductor device of claim 3, wherein the conductive structure is formed through at least a given one of the STI structures, the conductive structure providing electrical connection between the second top contact formed on the upper surface of the SOI substrate and the electrode of the p-n junction diode formed on the backside of the semiconductor device.

5. The semiconductor device of claim 1, wherein the p-n junction diode further comprises a dielectric layer formed on at least a portion of an upper surface of the active device layer of the SOI substrate.

6. A semiconductor device comprising at least one p-n junction diode formed on a silicon-on-insulator (SOI) substrate, the p-n junction diode comprising:
   first and second doped regions formed in an active device layer of the SOI substrate, the first doped region being formed on an upper surface of the second doped region and having a first conductivity type associated therewith, the second doped region having a second conductivity type associated therewith, the second conductivity type being opposite in polarity to the first conductivity type;
   a depletion region formed at an interface between the first and second doped regions;
   a back contact formed on a back surface of the second doped region and electrically connecting with the second doped region;
   a conductive interconnect layer formed on an upper surface of the SOI substrate, the interconnect layer comprising a first top contact providing electrical connection with the first doped region; and
   an electrode of the p-n junction diode formed on the backside of the semiconductor device, the electrode providing electrical connection with the back contact;
   wherein the second doped region comprises n-doped silicon, and wherein the back contact of the p-n junction diode comprises epitaxially grown $n^+$-doped hydrogenated crystalline silicon.

7. The semiconductor device of claim 6, wherein the back contact comprises epitaxially grown $n^+$-doped hydrogenated crystalline silicon with 5 to 40 atomic percent hydrogen.

* * * * *